US010964634B2

(12) United States Patent
Lin et al.

(10) Patent No.: US 10,964,634 B2
(45) Date of Patent: Mar. 30, 2021

(54) METHOD OF MANUFACTURING CIRCUIT CARRIER WITH EMBEDDED SEMICONDUCTOR SUBSTRATE

(71) Applicant: Unimicron Technology Corp., Taoyuan (TW)

(72) Inventors: Chien-Chen Lin, Taoyuan (TW); Tzu-Hsuan Wang, Taoyuan (TW); Kuan-Wen Fong, Keelung (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/162,396

(22) Filed: Oct. 17, 2018

(65) Prior Publication Data
US 2020/0075469 A1 Mar. 5, 2020

(30) Foreign Application Priority Data

Aug. 31, 2018 (TW) ................. 107130470

(51) Int. Cl.
*H01L 23/498* (2006.01)
*H01L 21/768* (2006.01)
(Continued)

(52) U.S. Cl.
CPC .. *H01L 23/49822* (2013.01); *H01L 21/76816* (2013.01); *H01L 23/49816* (2013.01);
(Continued)

(58) Field of Classification Search
CPC ... H01L 21/76816; H01L 24/17; H01L 24/27; H01L 21/4857; H01L 23/49822; H01L 23/49816; H01L 23/53233
See application file for complete search history.

(56) References Cited

U.S. PATENT DOCUMENTS 7,863,735 B1 * 1/2011 Cho ............... H05K 1/183
257/686
2013/0032390 A1 * 2/2013 Hu ................ H01L 23/147
174/266
(Continued)

FOREIGN PATENT DOCUMENTS

| CN | 107431027 | 12/2017 | |
|---|---|---|---|
| WO | 2017111790 | 6/2017 | |
| WO | WO-2017171738 A1 * | 10/2017 | ............. H01L 23/13 |

OTHER PUBLICATIONS

Definition of Integral, Dictionary.com, 2020, pp. 1-6. Accessed on World Wide Web on Sep. 15, 2020 at https://www.dictionary.com/browse/integral. (Year: 2020).*
(Continued)

*Primary Examiner* — Michael Jung
(74) *Attorney, Agent, or Firm* — JCIPRNET

(57) ABSTRACT

A circuit carrier with embedded substrate includes a circuit structure and an embedded substrate. The circuit structure includes a first dielectric layer, a first patterned circuit layer, a trench, and a plurality of first bumps. The first dielectric layer has a first surface and a second surface opposite to each other. The first patterned circuit layer is embedded in the first surface. The first bumps are disposed on the first surface and electrically connected to the first patterned circuit layer. The trench exposes a portion of the first dielectric layer. The embedded substrate is disposed in the trench and includes a plurality of second bumps. A chip package structure includes the above circuit carrier with embedded substrate.

16 Claims, 11 Drawing Sheets

(51) Int. Cl.
*H01L 23/00* (2006.01)
*H01L 23/532* (2006.01)

(52) U.S. Cl.
CPC ........ *H01L 23/53233* (2013.01); *H01L 24/17* (2013.01); *H01L 24/27* (2013.01)

(56) References Cited

U.S. PATENT DOCUMENTS

| | | | |
|---|---|---|---|
| 2014/0217610 A1* | 8/2014 | Jeng | H01L 23/49827 257/774 |
| 2015/0235989 A1* | 8/2015 | Yu | H01L 23/5385 257/712 |
| 2016/0056102 A1* | 2/2016 | Konchady | H01L 23/5389 174/263 |
| 2016/0066423 A1 | 3/2016 | Sakamoto et al. | |
| 2016/0133552 A1 | 5/2016 | Roy et al. | |
| 2016/0172317 A1* | 6/2016 | Tsai | H01L 24/33 257/428 |
| 2017/0040264 A1 | 2/2017 | Qian et al. | |
| 2018/0358298 A1* | 12/2018 | Zhai | H01L 23/5386 |
| 2019/0057915 A1* | 2/2019 | Starkston | H01L 23/5383 |
| 2019/0067207 A1* | 2/2019 | Hu | H01L 21/561 |
| 2019/0131270 A1* | 5/2019 | Lee | H01L 23/49822 |

OTHER PUBLICATIONS

"Office Action of Taiwan Counterpart Application," dated Mar. 12, 2019, p. 1-p. 6.
"Office Action of China Counterpart Application," dated Dec. 7, 2020, p1-p9.

* cited by examiner

METHOD OF MANUFACTURING CIRCUIT CARRIER WITH EMBEDDED SEMICONDUCTOR SUBSTRATE

CROSS-REFERENCE TO RELATED APPLICATION

This application claims the priority benefit of Taiwan application serial no. 107130470, filed on Aug. 31, 2018. The entirety of the above-mentioned patent application is hereby incorporated by reference herein and made a part of this specification.

BACKGROUND

1. Field of the Invention

This invention relates to a circuit carrier, a manufacturing method thereof and a package structure, and particularly to a circuit carrier with embedded substrate, a manufacturing method thereof and a chip package structure.

2. Description of Related Art

Currently, in a package structure having a plurality of interconnected chips, interposers are often used as a bridging element to connect different chips and to dispose the chips on a circuit carrier. However, with the consumer's demand for miniaturization and thinning of electronic products, disposing interposers on the circuit carrier limits the size of the chip package structure, especially the Z-axis height of the overall chip package structure. Therefore, how to effectively reduce the Z-axis height of the overall chip package structure is a problem to be solved in the field.

SUMMARY

The present invention provides a circuit carrier with embedded substrate, which can be used to integrate a variety of different chips with a thinner thickness.

The present invention provides a method of manufacturing a circuit carrier with embedded substrate, which is capable of manufacturing a circuit carrier that can integrate a plurality of different components and has a relatively thin thickness.

The present invention provides a chip package structure having a thin package thickness and a small package volume.

A circuit carrier with embedded substrate of the present invention includes a circuit structure and an embedded substrate. The circuit structure includes a first dielectric layer, a first patterned circuit layer, a trench, and a plurality of first bumps. The first dielectric layer has a first surface and a second surface opposite to each other. The first patterned circuit layer is buried in the first surface. The first bumps are disposed on the first surface. The first bumps are electrically connected to the first patterned circuit layer. The trench exposes a portion of the first dielectric layer. The embedded substrate is disposed in the trench and includes multiple second bumps.

In an embodiment of the invention, the circuit structure further includes at least two second patterned circuit layers, at least one second dielectric layer, and at least one first conductive via. The second patterned circuit layer and the second dielectric layer are sequentially stacked on the second surface of the first dielectric layer. The first conductive via penetrates the second dielectric layer. The second patterned circuit layer is electrically connected to another second patterned circuit layer through the first conductive via.

In an embodiment of the invention, the circuit structure further includes a patterned solder mask. The patterned solder mask is disposed at least on the bottom surface of the circuit structure, relatively far from the first patterned circuit layer, and on the first surface of the first dielectric layer. The patterned solder mask covers the first dielectric layer, the first patterned circuit layer, and the embedded substrate.

In an embodiment of the invention, the patterned solder mask exposes first bumps and second bumps.

In an embodiment of the invention, the first dielectric layer has a third surface. The third surface is located on the portion of the first dielectric layer exposed by the trench. The third surface is aligned with the lower surface of the first patterned circuit layer.

In an embodiment of the invention, the first bumps are aligned with the second bumps.

In an embodiment of the invention, the embedded substrate further includes at least one dielectric layer, at least one patterned conductive layer, and at least one conductive via.

The chip package structure of the present invention includes the above circuit carrier with embedded substrate, a first chip, and a second chip. The first chip is disposed on the circuit structure of the above circuit carrier with embedded substrate. The first chip is electrically connected to the circuit structure through the first bumps, and the first chip is electrically connected to the embedded substrate through the second bumps. The second chip is disposed on the circuit structure of the above circuit carrier with embedded substrate. The second chip is electrically connected to the circuit structure through the first bumps, and the second chip is electrically connected to the embedded substrate through the second bumps.

In an embodiment of the invention, the first chip includes a plurality of first solder balls, and the second chip includes a plurality of second solder balls. The first chip is electrically connected to the first patterned circuit layer and the embedded substrate through the first solder balls. The second chip is electrically connected to the first patterned circuit layer and the embedded substrate through the second solder balls.

A method of manufacturing a circuit carrier with embedded substrate of the present invention includes the following steps. A circuit structure is provided and the circuit structure includes a first dielectric layer, a first patterned circuit layer, a trench, and a plurality of first bumps. The first dielectric layer has a first surface and a second surface opposite to each other. The first patterned circuit layer is buried in the first surface. The first bumps are disposed on the first surface. The first bumps are electrically connected to the first patterned circuit layer. The trench exposes a portion of the first dielectric layer. An embedded substrate is disposed in the trench. The embedded substrate includes multiple second bumps.

In an embodiment of the invention, the step of providing the circuit structure includes the following steps. A core layer is provided and the core layer includes a core dielectric layer, at least one release layer, and at least one copper foil layer. A first patterned copper layer is formed on the copper foil layer, and the first patterned copper layer includes a plurality of openings. A nickel layer is formed on the first patterned copper layer, and the nickel layer covers the first patterned copper layer and openings. The first bumps and the first patterned circuit layer are formed on the nickel layer. The first dielectric layer is pressed on the first patterned circuit layer. The first dielectric layer covers the first patterned circuit layer and the first bumps. The core layer, the first patterned copper layer, and the nickel layer are removed to expose the first bump and the first patterned circuit layer. A portion of the first patterned circuit layer is removed to form a trench and expose portions of the first dielectric layer.

In an embodiment of the invention, after the first dielectric layer is laminated on the first patterned circuit layer, the method further includes the following steps. At least two second patterned circuit layers, at least one second dielectric layer, and at least one first conductive via are formed. The second patterned circuit layer and the second dielectric layer are sequentially stacked on the second surface of the first dielectric layer. The first conductive via penetrates the second dielectric layer. The second patterned circuit layer is electrically connected to another second patterned circuit layer through the first conductive via.

In an embodiment of the invention, the step of forming the first patterned copper layer on the copper foil layer comprises the following steps. A first patterned photoresist layer is formed on the copper foil layer. A first patterned copper layer is formed on the copper foil layer, and the first patterned copper layer does not cover the first patterned photoresist layer. The first patterned photoresist layer is removed.

In an embodiment of the invention, the step of forming the first bumps and the first patterned circuit layer on the nickel layer comprises the following. A second patterned photoresist layer is formed on the nickel layer. A second patterned copper layer is formed on the nickel layer, wherein the second patterned copper layer does not cover the second patterned photoresist layer and the second patterned copper layer fills the openings of the first patterned copper layer. The second patterned photoresist layer is removed.

In an embodiment of the invention, the step of removing the core layer, the first patterned copper layer, and the nickel layer includes the followings. A stripping process is performed to separate the release layer from the copper foil layer from each other. The copper foil layer, the first patterned copper layer, and the nickel layer are sequentially removed by etching.

In an embodiment of the invention, after disposing the embedded substrate in the trench, the method further includes the followings. A patterned solder mask is formed on the bottom surface of the circuit structure relatively far from the first patterned circuit layer and the first surface of the first dielectric layer. The patterned solder mask covers the first dielectric layer, the first patterned circuit layer, and the embedded substrate.

Based on the above, in the circuit carrier with embedded substrate of the present invention, the manufacturing method thereof and the chip package structure, since the circuit structure includes the trench, the embedded substrate can be disposed in the trench, and the first chip and the second chip may electrically connect to the circuit structure through the first bumps, respectively. The first chip and the second chip may electrically connect to the embedded substrate through the second bumps, respectively. With this design, the circuit carrier with embedded substrate of the present invention can integrate a plurality of different chips, have a thinner thickness, and make the chip package structure of the present invention have a thinner package thickness and a smaller package volume.

The above described features and advantages of the present invention will be more apparent from the following description.

DESCRIPTION OF THE EMBODIMENTS

FIG. 1A to FIG. 1M are schematic cross-sectional diagrams showing a method of fabricating a circuit carrier with embedded substrate according to an embodiment of this invention. Referring first to FIG. 1J, a circuit structure 110 is first provided in this embodiment.

Figure 1A:
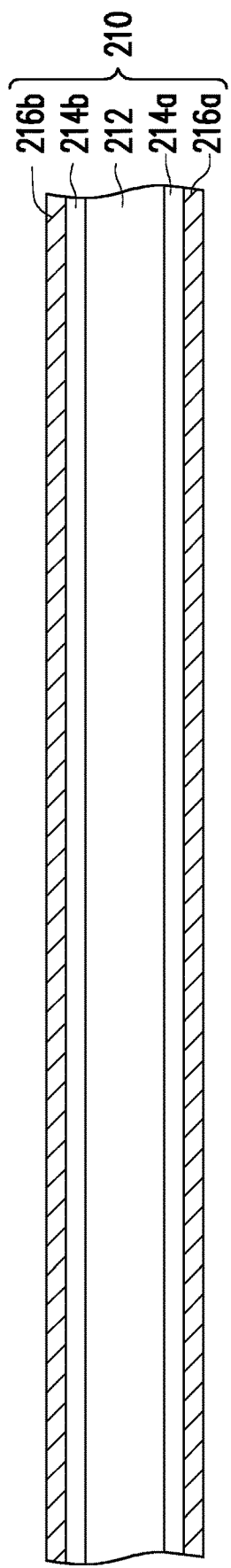
FIG. 1A to FIG. 1M are schematic cross-sectional diagrams showing a method of fabricating a circuit carrier with embedded substrate according to an embodiment of this invention.

In detail, referring to FIG. 1A, a core layer 210 is provided, wherein the core layer 210 includes a core dielectric layer 212, at least one release layer 214a and 214b (shown schematically as two layers in FIG. 1A), and at least one copper foil layer 216a and 216b (shown schematically as 2 layers in FIG. 1A).

Figure 1B:
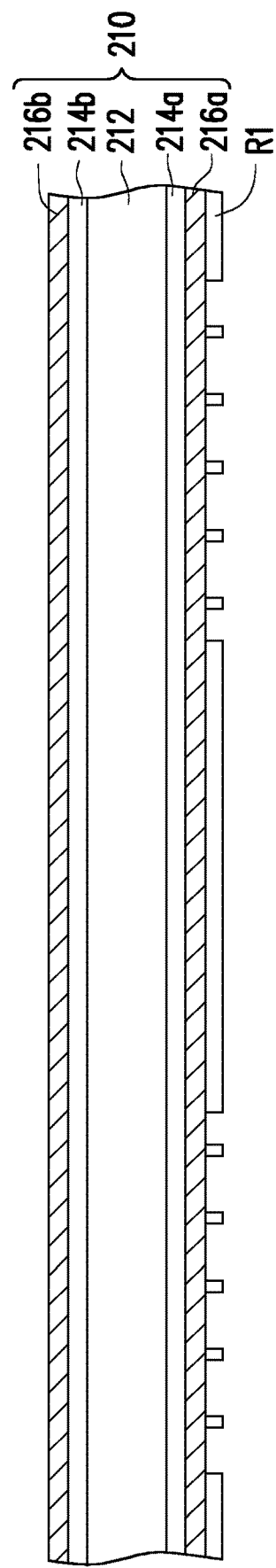
Figure 1C:
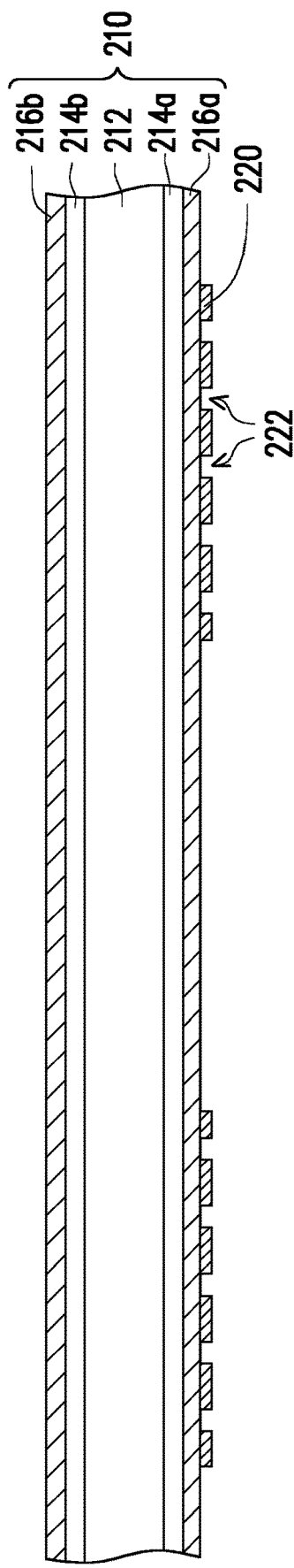

Next, referring to FIG. 1B and FIG. 1C, a first patterned copper layer 220 is formed on the copper foil layer 216a. In this embodiment, the step of forming the first patterned copper layer 220 on the copper foil layer 216a is as follows. First, a first patterned photoresist layer R1 is formed on the copper foil layer 216a. Next, a first cooper layer is formed on the first patterned photoresist layer R1 and the exposed copper foil layer 216a. The first copper layer may be formed by plating or other suitable methods. Then, the first patterned photoresist layer R1 together with the first copper layer formed thereon are removed to obtain the first patterned copper layer 220, having a plurality of openings 222, on the copper foil layer 216a. It should be noted that although this embodiment has disclosed the steps of forming the first patterned copper layer 220 on the copper foil layer 216a, the invention is not limited thereto.

Figure 1D:
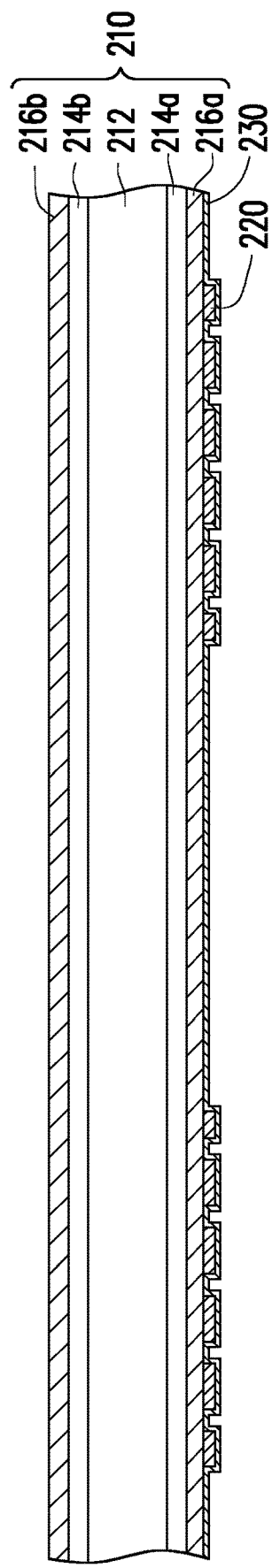

Then, please refer to FIG. 1D, a nickel layer 230 is conformally formed on the first patterned copper layer 220 and the exposed copper foil layer 216a, so that the nickel layer 230 completely covers the first patterned copper layer 220 and the openings 222 and has a uniform thickness.

Figure 1E:
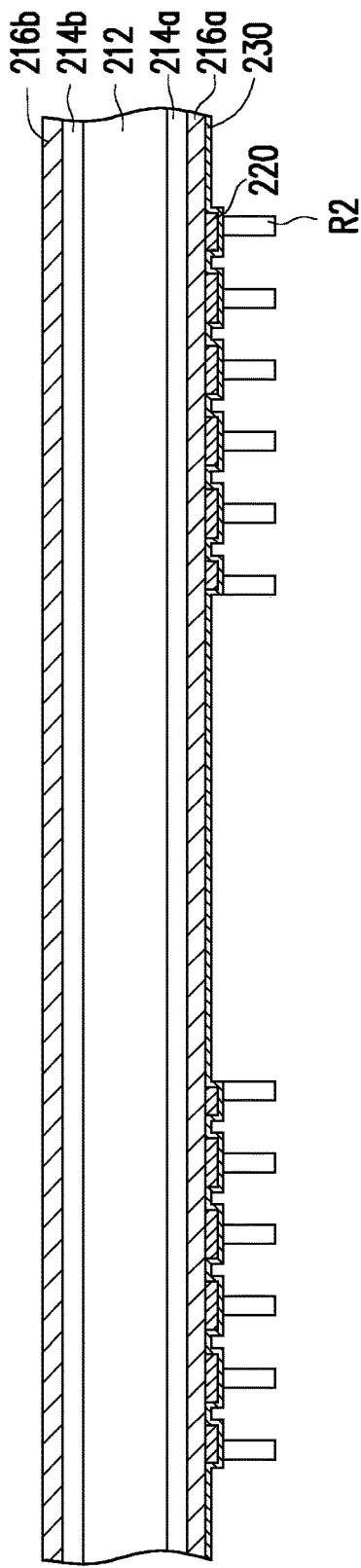
Figure 1F:
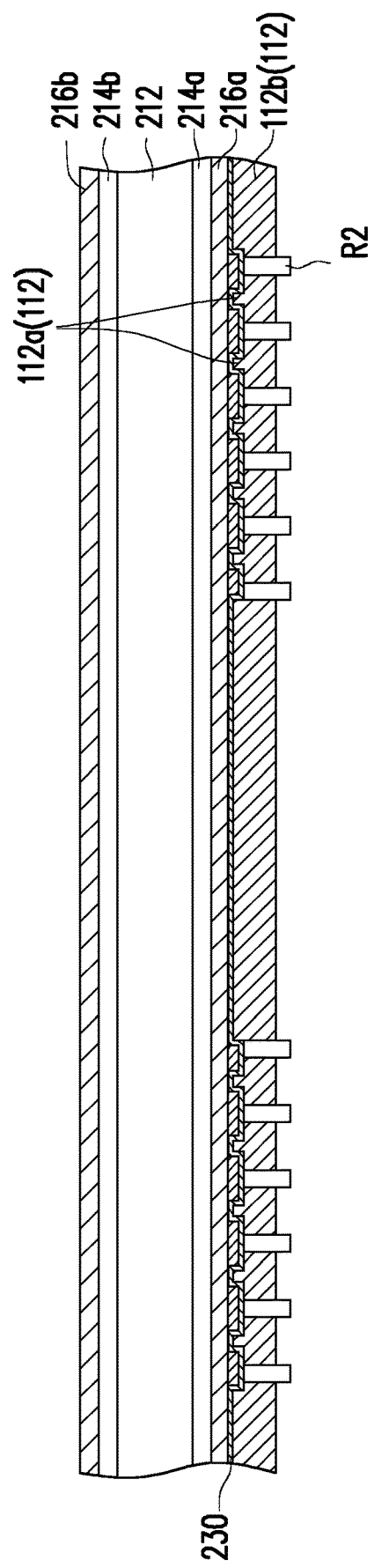
Figure 1G:
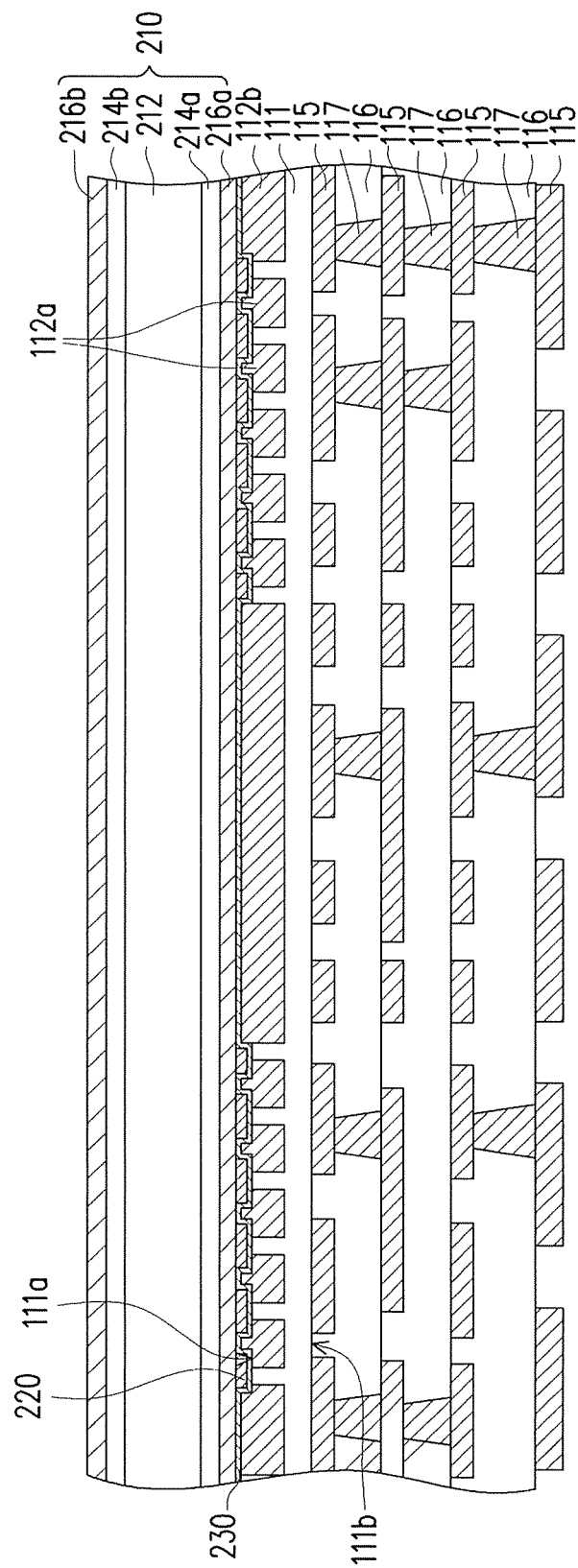

Next, please refer to FIG. 1E and FIG. 1F simultaneously, a plurality of first bumps 112a and a first patterned circuit layer 112b are formed on the nickel layer 230. In this embodiment, the steps of forming the plurality of first bumps 112a and a first patterned circuit layer 112b include forming a second patterned photoresist R2 on the nickel layer 230 in FIG. 1E, and then forming a second patterned copper layer 112 including the first bumps 112a (shown schematically to have 10 first bumps 112a in FIGS. 1F and 1G) in the openings 222 of the first patterned copper layer 220 and the first patterned circuit layer 112b (shown schematically in FIGS. 1F and 1G) between the second patterned photoresist layer R2, without covering the second patterned photoresist layer R2. In this embodiment, the first bumps 112a are integrally formed with the first patterned circuit layer 112b. It should be noted that although this embodiment has disclosed the steps of forming the first bumps 112a and the first patterned circuit layer 112b on the nickel layer 230, the present invention is not limited thereto.

Furthermore, referring (again) to FIG. 1G, a first dielectric layer 111 is pressed onto the first patterned circuit layer 112b. The first dielectric layer 111 has a first surfaces 111a and a second surface 111b opposite to each other, and the first dielectric layer 111 covers the first patterned circuit layer 112b and the first bumps 112a.

Then, at least two second patterned circuit layers 115 (shown schematically as four layers in FIG. 1G), at least one second dielectric layer 116 (shown schematically as three layers in FIG. 1G), and at least one first conductive via 117 are selectively formed (illustrated as 11 first conductive vias 117 in FIG. 1G) on the first dielectric layer 111. Specifically, the second patterned circuit layer 115 and the second dielectric layer 116 are sequentially stacked on the second surface 111b of the first dielectric layer 111. The first conductive vias 117 penetrate the second dielectric layer 116. The second patterned circuit layer 115 is electrically connected to another second patterned circuit layer 115 through the first conductive via 117.

Figure 1H:
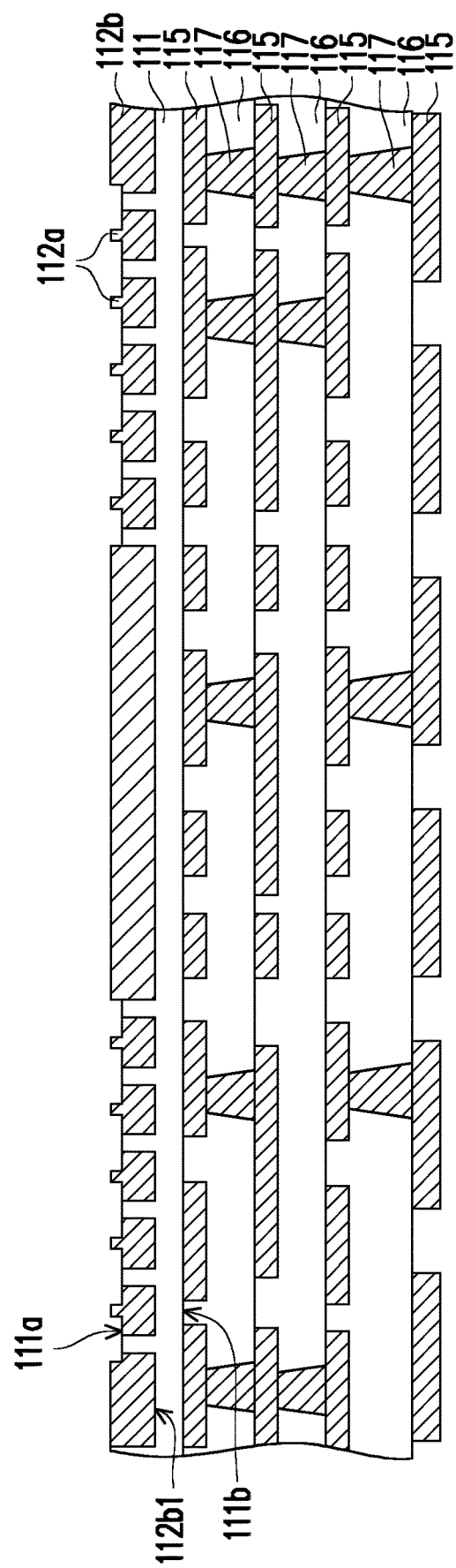

Then, referring to FIG. 1H, the core layer 210, the first patterned copper layer 220, and the nickel layer 230 are removed to expose the first bumps 112a and the first patterned circuit layer 112b. In this embodiment, the steps of removing the core layer 210, the first patterned copper layer 220, and the nickel layer 230 include, for example, a stripping process is first performed to separate the release layer 214a and the copper foil layer 216a from each other, and then sequentially removing the copper foil layer 216a, the first patterned copper layer 220, and the nickel layer 230 by etching. It should be noted that although this embodiment has disclosed the steps of removing the core layer 210, the first patterned copper layer 220, and the nickel layer 230, the present invention is not limited thereto.

Figure 1I:
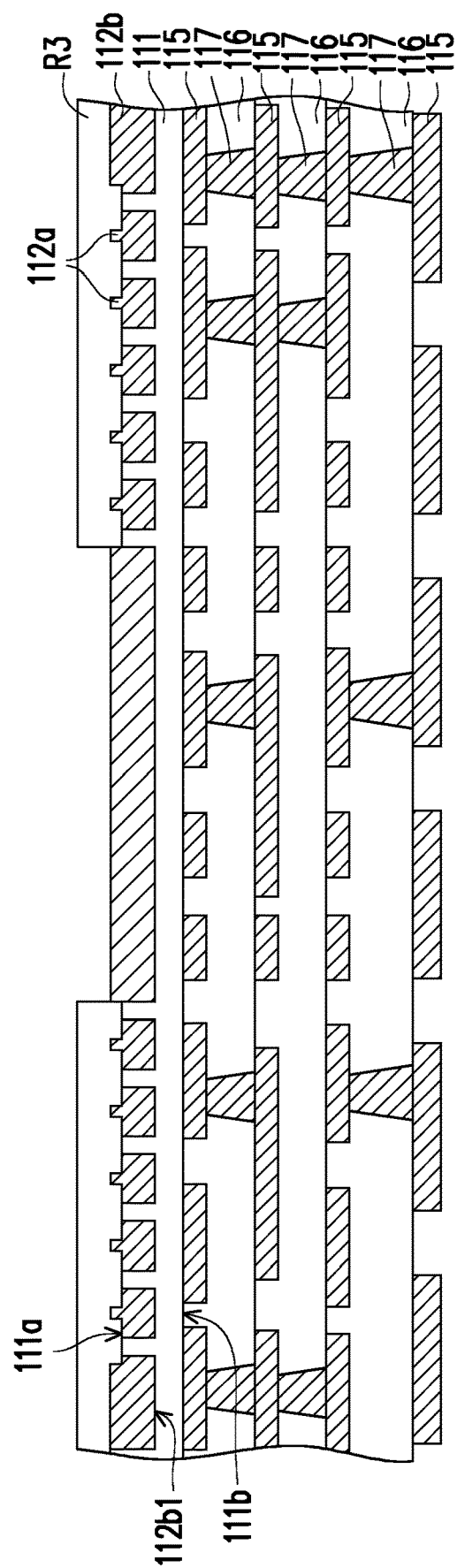
Figure 1J:
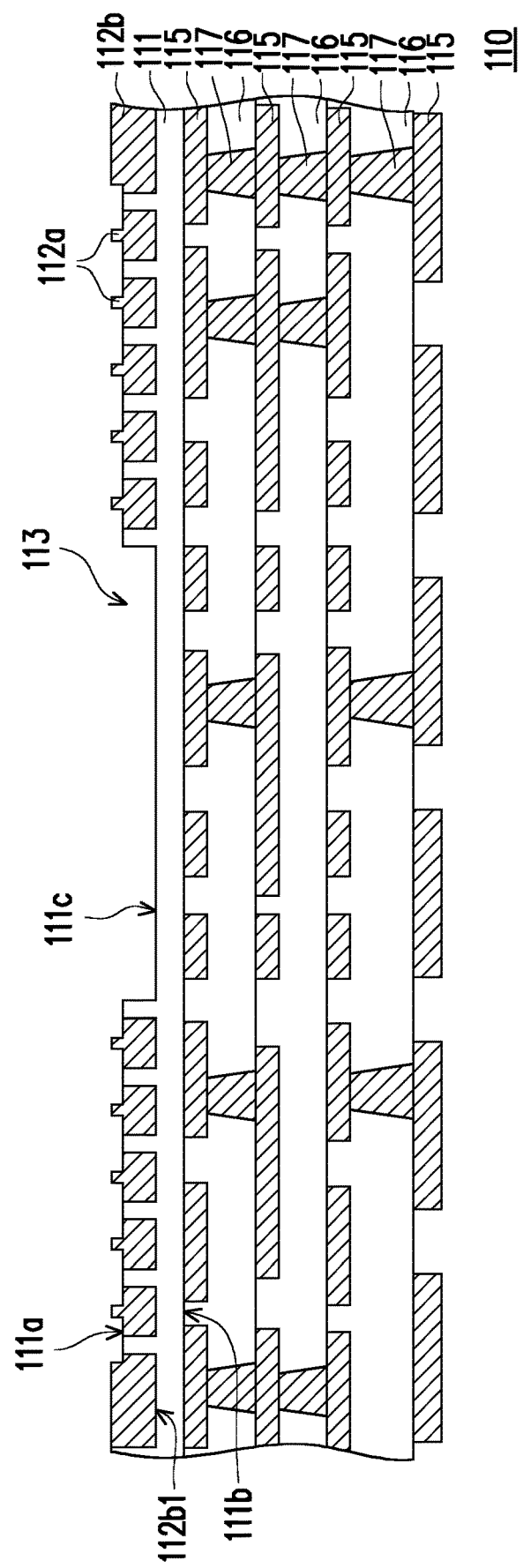

Referring to FIG. 1I and FIG. 1J simultaneously, a portion of the first patterned circuit layer 112b is removed to form a trench 113 to expose a portion of the first dielectric layer 111. In this embodiment, the steps of removing a portion of the first patterned circuit layer 112b to form the trench 113 include, for example, forming a third patterned photoresist layer R3, such as a dry film, on the first dielectric layer 111 and the first patterned circuit layer 112b to expose the portion of the first patterned circuit layer 112b to form the trench 113 later in FIG. 1I, and removing the portion of the first patterned circuit layer 112b exposed by the third patterned photoresist layer R3 to form the trench 113 to expose the portion of the first dielectric layer 111 in FIG. 1J. At this time, the first dielectric layer 111 further has a third surface 111c. The third surface 111c is located on the portion of the first dielectric layer 111 exposed by the trench 113, and the third surface 111c is aligned with the lower surface 112b1 of the first patterned circuit layer 112b. It is to be noted that although this embodiment has disclosed the steps of removing the portion of the first patterned circuit layer 112b to form the trench 113, the invention is not limited thereto. At this time, the circuit structure 110 has been completed.

Figure 1K:
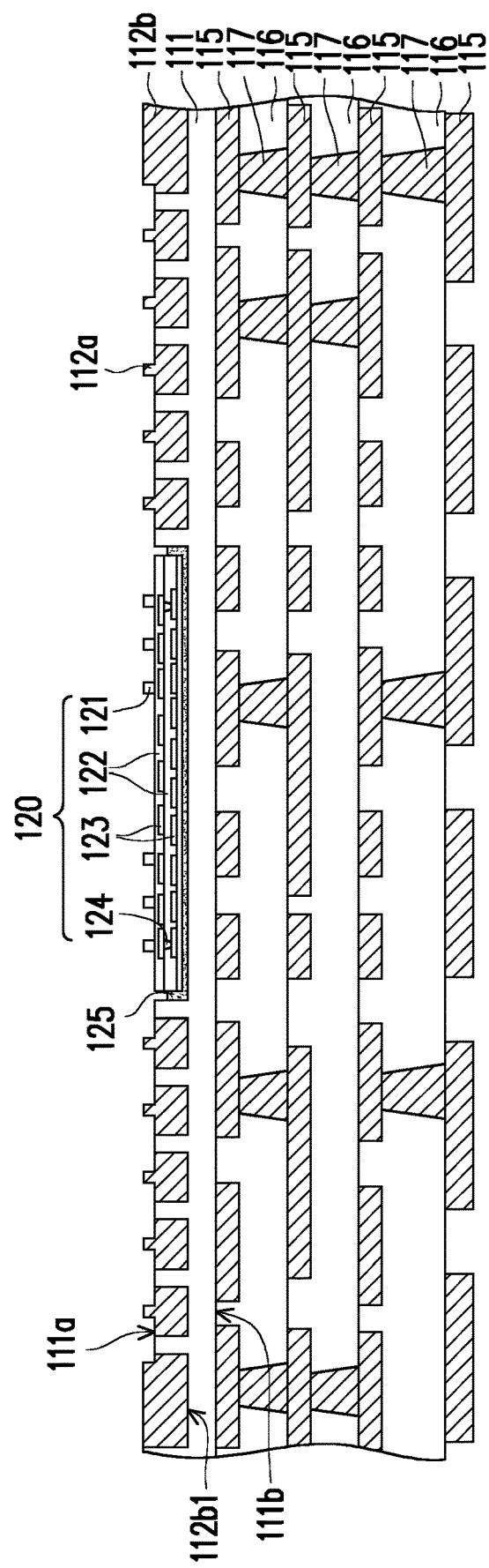

Next, referring to FIG. 1K, the embedded substrate 120 is disposed in the trench 113 of the circuit structure 110. In FIG. 1K, the embedded substrate 120 includes a plurality of second bumps 121 (shown schematically to have 6 second bumps 121 in FIG. 1K), at least one dielectric layer 122 (shown schematically as three layers in FIG. 1K), and at least one patterned conductive layer 123 (shown schematically as 2 layers in FIG. 1K) and at least one conductive via 124 (shown schematically to have 2 conductive vias 124 in FIG. 1K). In this embodiment, for example, the embedded substrate 120 is adhered to the third surface 111c of the first dielectric layer 111 by a glue layer 125, and the second bumps 121 of the embedded substrate 120 are aligned with the first bumps 112a of the circuit structure 110. Here, the material of the dielectric layer 122 of the embedded substrate 120 may be an organic material, such as a photosensitive polyimide, a photo-imagitable dielectric (PID) or other suitable organic material, but is not limited thereto. In some other embodiments, the material of the dielectric layer 122 of the embedded substrate 120 may also be an inorganic material, such as glass, silicon oxide, other ceramic materials, and the embedded substrate 120 may also be silicon chips or other semiconductors, but is not limited thereto.

Figure 1L:
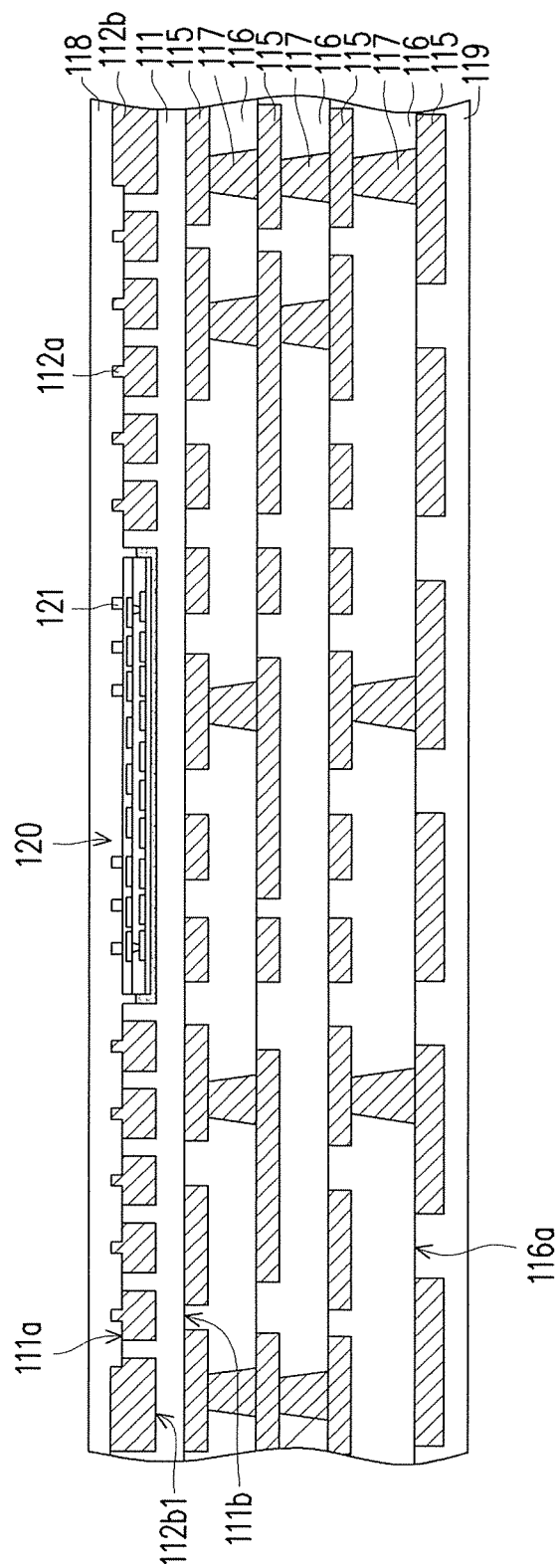
Figure 1M:
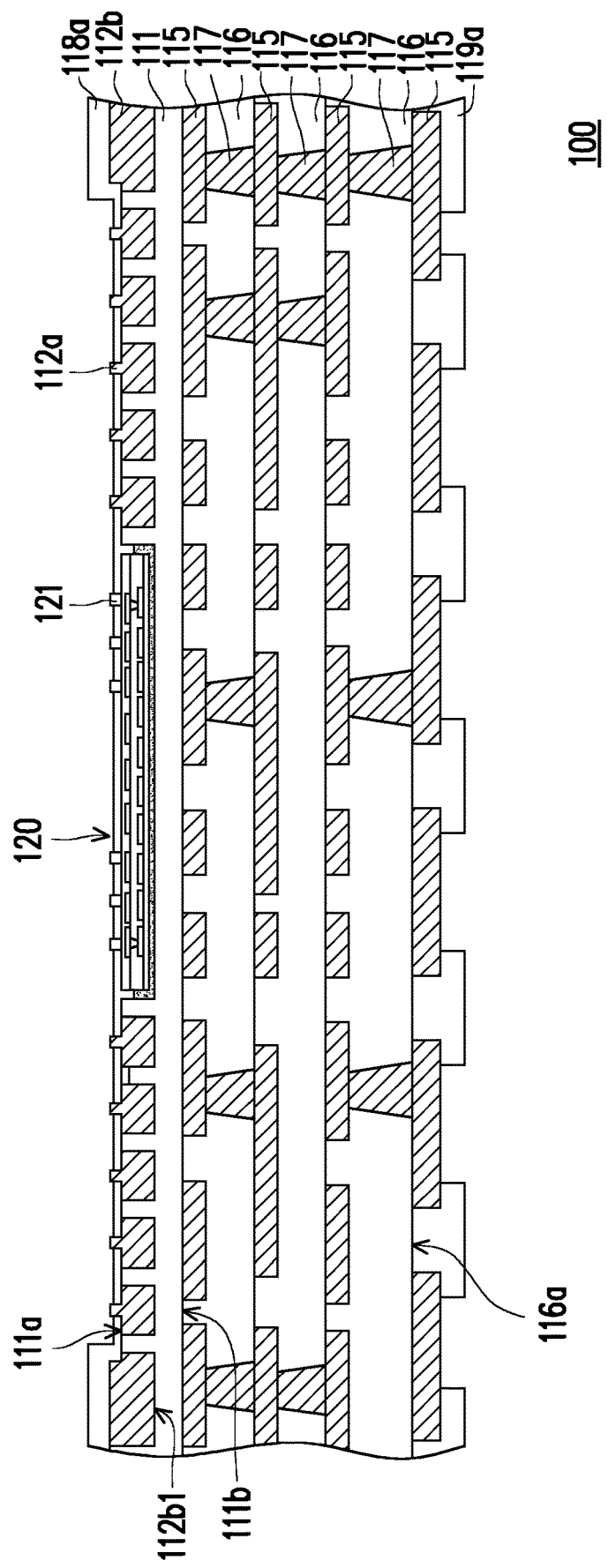

Then, referring to FIG. 1L and FIG. 1M simultaneously, patterned solder masks 118a and 119a are respectively formed on the first surface 111a of the first dielectric layer 111 and on the bottom surface 116a, being relatively far from the first patterned circuit layer 112b.

In FIG. 1L, a solder mask 118 is first disposed on the first surface 111a of the first dielectric layer 111, and a solder mask 119 is disposed on the bottom surface 116a of the circuit structure 110 relatively far from the first patterned circuit layer 112b. That is, the solder mask 118 covers the first dielectric layer 111, the first patterned circuit layer 112b, and the embedded substrate 120. The solder mask 119 covers the second patterned circuit layer 115 and the second dielectric layer 116 of the circuit structure 110 far from the first patterned circuit layer 112b. Next, in FIG. 1M, the solder mask 118 is thinned to form a patterned solder mask 118a to expose the first bumps 112a of the circuit structure 110 and the second bumps 121 of the embedded substrate 120. The solder mask 119 is then patterned to form a patterned solder mask 119a to expose a portion of the second patterned circuit layer 115 of the circuit structure 110, which is far from the first patterned circuit layer 112b. Here, the solder masks 118 and 119 are formed by, for example, a printing method, but are not limited thereto. At this point, the circuit carrier 100 with embedded substrate has been fabricated.

Based on the above, in this embodiment, the circuit carrier 100 having the embedded substrate includes the circuit structure 110 and the embedded substrate 120. The circuit structure 110 includes the first dielectric layer 111, the first patterned circuit layer 112b, the trench 113, and the plurality of first bumps 112a. The first dielectric layer 111 has the first surface 111a and the second surface 111b opposite to each other. The first patterned circuit layer 112b is buried in the first surface 111a. The first bumps 112a are disposed on the first surface 111a. The first bumps 112a are electrically connected to the first patterned circuit layer 112b. The trench 113 exposes a portion of the first dielectric layer 112b. The embedded substrate 120 is disposed within the trench 113, and the embedded substrate 120 includes the second bumps 121.

It is to be noted that the following embodiments use the same reference numerals and the parts of the above-mentioned embodiments, and the same reference numerals are used to refer to the same or similar elements, and the description of the same technical content is omitted. For the description of the omitted portions, reference may be made to the foregoing embodiments, and the description is not repeated in the following embodiments.

Figure 2:
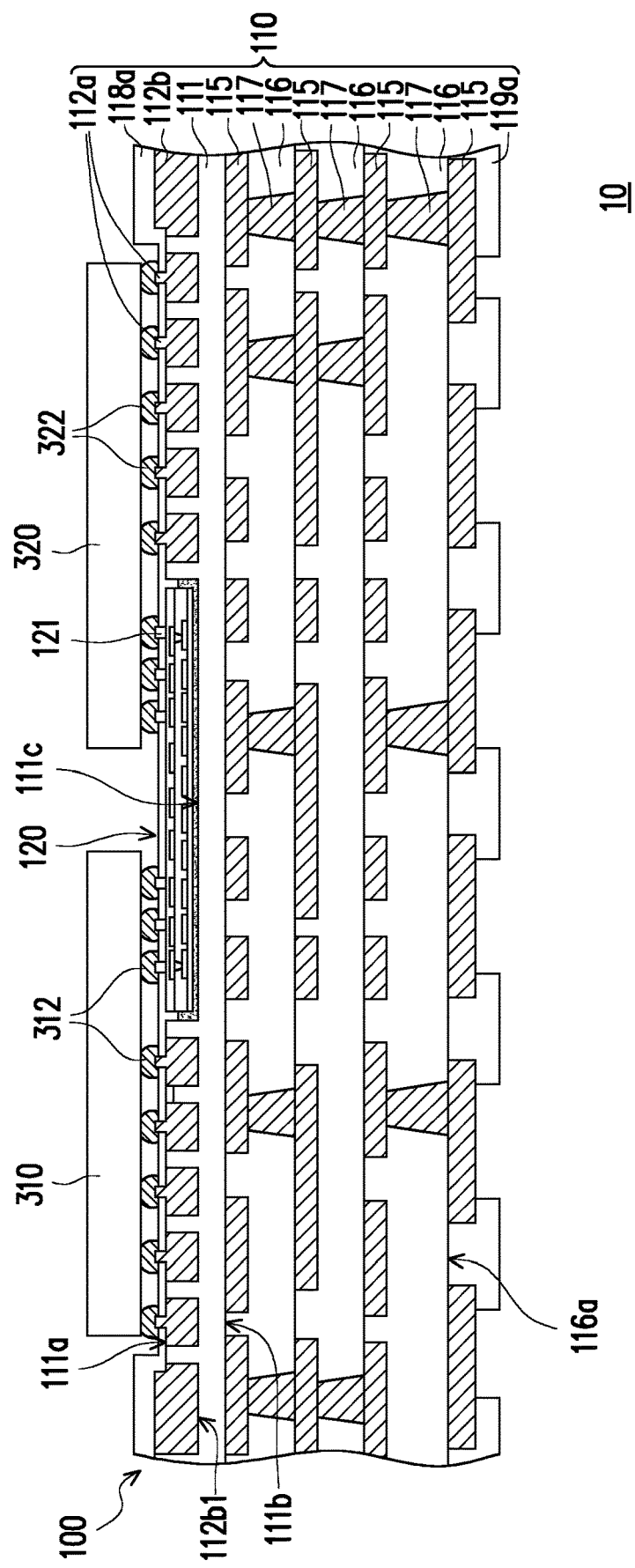
FIG. 2 is a cross-sectional diagram showing a chip package structure according to an embodiment of this invention.

FIG. 2 is a cross-sectional diagram showing a chip package structure according to an embodiment of this invention.

In this embodiment, the chip package structure includes a circuit carrier 100 having an embedded substrate, a first chip 310, and a second chip 320. The first chip 310 is disposed on the circuit structure 110 of the circuit carrier 100 having the embedded substrate, and the second chip 320 is disposed on the circuit structure 110 of the circuit carrier 100 having the embedded substrate. The first chip 310 is electrically connected to the circuit structure 110 through the first bumps 112a, and the first chip 310 is electrically connected to the embedded substrate 120 through the second bumps 121. The second chip 320 is electrically connected to the circuit structure 110 through the first bumps 112a, and the second chip 320 is electrically connected to the embedded substrate 120 through the second bumps 121.

In detail, the first chip 310 includes a plurality of first solder balls 312 (8 first solder balls 312 are shown in FIG. 2), and the second chip 320 includes a plurality of second solder balls 322 (8 second solder balls 322 are shown in FIG. 2). The first chip 310 is electrically connected to the first patterned circuit layer 112b and the embedded substrate 120 through the first solder balls 312, and the second chip 320 is electrically connected to the first patterned circuit layer 112b and the embedded substrate 120 though the second solder balls 322.

In summary, in the circuit carrier having the embedded substrate of the present invention, the manufacturing method thereof and the chip package structure, since the circuit structure includes the trench, the embedded substrate can be configured in the trench, and the first chip and the second chip may be electrically connected to the circuit structure through the first bumps, respectively, and the first chip and the second chip may be electrically connected to the embedded substrate through the second bumps, respectively. By this design, the circuit carrier having the embedded substrate of the present invention can integrate a plurality of different chips and have a thinner thickness, as well as enables the chip package structure of the present invention to have a thinner package thickness and a smaller package volume.

Although the present invention has been disclosed in the above embodiments, it is not intended to limit the invention, and those skilled in the art can make a few changes without departing from the spirit and scope of the invention. The scope of protection of the present invention is defined by the scope of the appended claims.

What is claimed is:

1. A circuit carrier with embedded substrate, comprising:
a circuit structure, comprising:
  a first dielectric layer having a first surface and a second surface opposite to each other;
  a first patterned circuit layer embedded in the first surface and exposed on the first surface, wherein the first patterned circuit layer is a single layer;
  a plurality of first bumps disposed on the first surface and electrically connected to the first patterned circuit layer; and
  a trench recessing in the first dielectric layer and exposing a portion of the first dielectric layer; and
an embedded substrate disposed in the trench and having a plurality of second bumps,
wherein surfaces of the first bumps far from the first surface of the first dielectric layer are aligned with surfaces of the second bumps far from the first surface of the first dielectric layer,
wherein the first dielectric layer further has a third surface located on the portion of the first dielectric layer exposed by the trench, and the third surface is aligned with a lower surface of the first patterned circuit layer.

2. The circuit carrier with embedded substrate of claim 1, wherein the circuit structure further comprises at least two second patterned circuit layer, at least one second dielectric layer, and at least one first conductive via, wherein the second patterned circuit layer and the second dielectric layer are sequentially stacked on the second surface of the first dielectric layer, the first conductive via penetrates the second dielectric layer, and the second patterned circuit layer is electrically connected to the other second patterned circuit layer through the first conductive via.

3. The circuit carrier with embedded substrate of claim 1, wherein the circuit structure further comprises a patterned solder mask at least disposed on a bottom surface of the circuit structure and the first surface of the first dielectric layer, and the patterned solder mask covers the first dielectric layer, the first patterned circuit layer, and the embedded substrate.

4. The circuit carrier with embedded substrate of claim 3, wherein the patterned solder mask exposes the first bumps and the second bumps.

5. The circuit carrier with embedded substrate of claim 1, wherein the embedded substrate further comprises at least one dielectric layer, at least one patterned conductive layer, and at least one conductive via.

6. A chip package structure, comprising:
the circuit carrier with embedded substrate of claim 1;
a first chip disposed on the circuit structure of the circuit carrier with embedded substrate, wherein the first chip is electrically connected to the circuit structure through the first bumps, and the first chip is electrically connected to the embedded substrate through the second bumps; and
a second chip disposed on the circuit structure of the circuit carrier with embedded substrate, wherein the second chip is electrically connected to the circuit structure through the first bumps, and the second chip is electrically connected to the embedded substrate through the second bumps.

7. The chip package structure of claim 6, wherein the first chip comprises a plurality of first solder balls and electrically connected to the first patterned circuit layer and the embedded substrate through the first solder balls, and the second chip comprises a plurality of second solder balls and electrically connected to the first patterned circuit layer and the embedded substrate through the second solder balls.

8. A method of manufacturing a circuit carrier with embedded substrate, the method comprising:
providing a circuit structure, wherein the circuit structure comprises:
  a first dielectric layer having a first surface and a second surface opposite to each other;
  a first patterned circuit layer embedded in the first surface and exposed on the first surface, wherein the first patterned circuit layer is a single layer;
  a plurality of first bumps disposed on the first surface and electrically connecting to the first patterned circuit layer; and
  a trench recessing in the first dielectric layer and exposing a portion of the first dielectric layer; and
disposing an embedded substrate in the trench, wherein the embedded substrate comprises a plurality of second bumps,
wherein surfaces of the first bumps far from the first surface of the first dielectric layer are aligned with surfaces of the second bumps far from the first surface of the first dielectric layer,
wherein the first dielectric layer further has a third surface located on the portion of the first dielectric layer exposed by the trench, and the third surface is aligned with a lower surface of the first patterned circuit layer.

9. The method of claim 8, wherein the step of providing the circuit structure comprises:

providing a core layer comprising a core dielectric layer, at least one release layer, and at least one copper foil layer;

forming a first patterned copper layer on the copper foil layer, and the first patterned copper layer comprises a plurality of openings;

forming a nickel layer on the first patterned copper layer to cover the first patterned copper layer and the openings;

forming the first bumps and the first patterned circuit layer on the nickel layer;

pressing the first dielectric layer on the first patterned circuit layer, wherein the first dielectric layer covers the first patterned circuit layer and the first bumps;

removing the core layer, the first patterned copper layer, and the nickel layer to expose the first bumps and the first patterned circuit layer; and removing a portion of the first patterned circuit layer to form the trench and expose a portion of the first dielectric layer.

10. The method of claim 9, after the first dielectric layer is pressed onto the first patterned circuit layer, further comprising:

forming at least two second patterned circuit layers, at least one second dielectric layer, and at least one first conductive via, wherein the second patterned circuit layer and the second dielectric layer are sequentially stacked on the second surface of the first dielectric layer, the first conductive via penetrates the second dielectric layer, and the second patterned circuit layer is electrically connected to another second patterned circuit layer through the first conductive via.

11. The method of claim 9, wherein the step of forming the first patterned copper layer on the copper foil layer comprises:

forming a first patterned photoresist layer on the copper foil layer;

forming a first patterned copper layer on the copper foil layer, and the first patterned copper layer does not cover the first patterned photoresist layer;

remove the first patterned photoresist layer.

12. The method of claim 9, wherein the step of forming the first bumps and the first patterned circuit layer on the nickel layer comprises:

forming a second patterned photoresist layer on the nickel layer;

forming a second patterned copper layer on the nickel layer, wherein the second patterned copper layer does not cover the second patterned photoresist layer and the second patterned copper layer fills the openings of the first patterned copper layer; and removing the second patterned photoresist layer.

13. The method of claim 9, wherein the step of removing the core layer, the first patterned copper layer, and the nickel layer comprises:

performing a stripping process to separate the release layer from the copper foil layer; and sequentially removing the copper foil layer, the first patterned copper layer, and the nickel layer are by etching.

14. The method of claim 8, wherein the embedded substrate further comprises at least one dielectric layer, at least one patterned conductive layer, and at least one conductive via.

15. The method of claim 8, after the embedded substrate is disposed in the trench, further comprising:

forming a patterned solder mask on a bottom surface of the circuit structure and the first surface of the first dielectric layer, such that the patterned solder mask covers the first dielectric layer, the first patterned circuit layer, and the embedded substrate, wherein the bottom surface is relatively far from the first patterned circuit layer.

16. The method of claim 15, wherein the patterned solder mask exposes the first bumps and the second bumps.

* * * * *